United States Patent
Masuda

(10) Patent No.: US 8,885,157 B2
(45) Date of Patent: Nov. 11, 2014

(54) TEST APPARATUS, TEST METHOD, AND DEVICE INTERFACE FOR TESTING A DEVICE UNDER TEST USING OPTICAL SIGNALING

(75) Inventor: Shin Masuda, Miyagi (JP)

(73) Assignee: Advantest Corporation, Tokyo (JP)

( * ) Notice: Subject to any disclaimer, the term of this patent is extended or adjusted under 35 U.S.C. 154(b) by 350 days.

(21) Appl. No.: 13/041,294

(22) Filed: Mar. 4, 2011

(65) Prior Publication Data

US 2011/0279812 A1 Nov. 17, 2011

(30) Foreign Application Priority Data

May 17, 2010 (JP) .................................. 2010-113486

(51) Int. Cl.
| | |
|---|---|
| *G01N 21/00* | (2006.01) |
| *G01R 31/28* | (2006.01) |
| *G01R 15/22* | (2006.01) |
| *G02B 6/42* | (2006.01) |
| *G01R 31/311* | (2006.01) |
| *G01J 1/28* | (2006.01) |

(52) U.S. Cl.
CPC ............ *G01R 31/2886* (2013.01); *G01R 15/22* (2013.01); *G02B 6/4206* (2013.01); *G01R 31/311* (2013.01); *G01J 1/28* (2013.01)
USPC ........................................ 356/237.1; 324/501

(58) Field of Classification Search
CPC ....... G01J 1/28; G01R 31/2886; G01R 15/22; G01R 31/311
USPC ..................... 356/72, 145–150, 237.1, 237.6; 324/501, 754
See application file for complete search history.

(56) References Cited

U.S. PATENT DOCUMENTS

| | | | | |
|---|---|---|---|---|
| 4,808,815 A | * | 2/1989 | Langley | .................... 250/227.28 |
| 5,570,011 A | * | 10/1996 | Henley | ...................... 324/762.03 |
| 6,433,867 B1 | * | 8/2002 | Esquivel | ..................... 356/237.2 |
| 2005/0128471 A1 | * | 6/2005 | Wilsher et al. | ............. 356/237.2 |
| 2006/0109015 A1 | * | 5/2006 | Thacker et al. | ................. 324/754 |
| 2007/0206846 A1 | * | 9/2007 | Cotton et al. | .................. 382/144 |
| 2007/0238206 A1 | * | 10/2007 | Aghababazadeh et al. | ..... 438/18 |

(Continued)

FOREIGN PATENT DOCUMENTS

| | | | | |
|---|---|---|---|---|
| JP | 2003254905 | | 9/2003 | |
| JP | WO2009057203 A1 | * | 5/2009 | ............. G01R 31/26 |

(Continued)

OTHER PUBLICATIONS

Young et al., "Optical I/O Technology for Tera-Scale Computing", IEEE Journal of Solid-State Circuits, Jan. 2010, vol. 45, No. 1, pp. 235-248.

(Continued)

*Primary Examiner* — Tarifur Chowdhury
*Assistant Examiner* — Michael P Lapage

(57) ABSTRACT

Provided is a test apparatus that tests a device under test including an optical coupler transmitting optical signals in a direction perpendicular to a device surface. The test apparatus includes a substrate on which the device under test is to be loaded, an optical transmission path that transmits the optical signals, and a lens section facing the optical coupler on the substrate that focuses the optical signals from an end of either the optical coupler or the optical transmission path to an end of the other.

20 Claims, 3 Drawing Sheets

(56) References Cited

U.S. PATENT DOCUMENTS

| | | | |
|---|---|---|---|
| 2008/0118202 A1 | 5/2008 | Kato et al. | |
| 2008/0247743 A1* | 10/2008 | Liang et al. | 396/175 |
| 2010/0007896 A1* | 1/2010 | Fishbaine | 356/603 |
| 2010/0239155 A1* | 9/2010 | Ichikawa et al. | 382/141 |

FOREIGN PATENT DOCUMENTS

| | | |
|---|---|---|
| KR | 20030080934 | 10/2003 |
| KR | 20070118594 | 12/2007 |
| KR | 20100035660 | 4/2010 |
| WO | 2007/013128 A1 | 2/2007 |

OTHER PUBLICATIONS

Thacker et al., "Prospects for Wafer-Level Testing of Gigascale Chips with Electrical and Optical I/O Interconnects", IEEE International Test Conference, 2006, Paper 25-1, pp. 1-7.

Masuda et al., "Liquid-crystal microlens with a beam-steering function", Applied Optics, Jul. 10, 1997, vol. 36, No. 20, pp. 4772-4778.

Applicant brings the attention of the Examiner to the following pending U.S. Appl. No. 13/038,344, filed Mar. 1, 2011 and U.S. Appl. No. 13/040,161, filed Mar. 3, 2011.

KR Office Action/ Search Report and Computer Translation Dated Dec. 10, 2012; Application No. 1020110106403.

\* cited by examiner

TEST APPARATUS, TEST METHOD, AND DEVICE INTERFACE FOR TESTING A DEVICE UNDER TEST USING OPTICAL SIGNALING

BACKGROUND

1. Technical Field

The present invention relates to a test apparatus, a test method, and a device interface.

2. Related Art

Conventionally, a test apparatus is used to test a device under test such as a CPU or a memory. The device under test can be provided with an optical interface, as shown in Patent Document 1 and Non-Patent Documents 1 and 2, for example.

Patent Document 1: International Publication WO 2007/013128

Non-Patent Document 1: Ian A. Young, et al., "Optical I/O Technology for Tera-Scale Computing", IEEE Journal of Solid-State Circuits, January 2010, Vol. 45, No. 1, pp. 235-248

Non-Patent Document 2: Hiren D. Thacker, James D. Meindl, "Prospects for Wafer-Level Testing of Gigascale Chips with Electrical and Optical I/O Interconnects", IEEE International Test Conference, 2006, 25-1

Non-Patent Document 3: Shin Masuda, et al., "Liquid-crystal microlens with a beam-steering function", APPLIED OPTICS, July 1997, Vol. 36, No. 20, pp. 4772-4778

When testing a device under test having an optical interface, an optical signal must be used as the test signal and input to an optical input section of the device under test, and the optical response signal output from an optical output section of the device under test must be detected. The test apparatus requires accurate adjustment of the optical axis of the optical input and output, and this decreases the throughput of the testing while increasing the testing cost. Furthermore, one method for testing a device under test provided with an optical interface includes testing of a package including an optical fiber. In this case, if the device under test does not perform as desired, the package must be rejected along with the device under test, thereby increasing the manufacturing cost.

SUMMARY

Therefore, it is an object of an aspect of the innovations herein to provide a test apparatus, a test method, and a device interface, which are capable of overcoming the above drawbacks accompanying the related art. The above and other objects can be achieved by combinations described in the independent claims. According to a first aspect related to the innovations herein, provided is a test apparatus that tests a device under test including an optical coupler transmitting optical signals in a direction perpendicular to a device surface. The test apparatus comprises a substrate on which the device under test is to be loaded; an optical transmission path that transmits the optical signals: and a lens section that is provided facing the optical coupler on the substrate and that focuses the optical signals from an end of one of the optical coupler and the optical transmission path to an end of the other.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
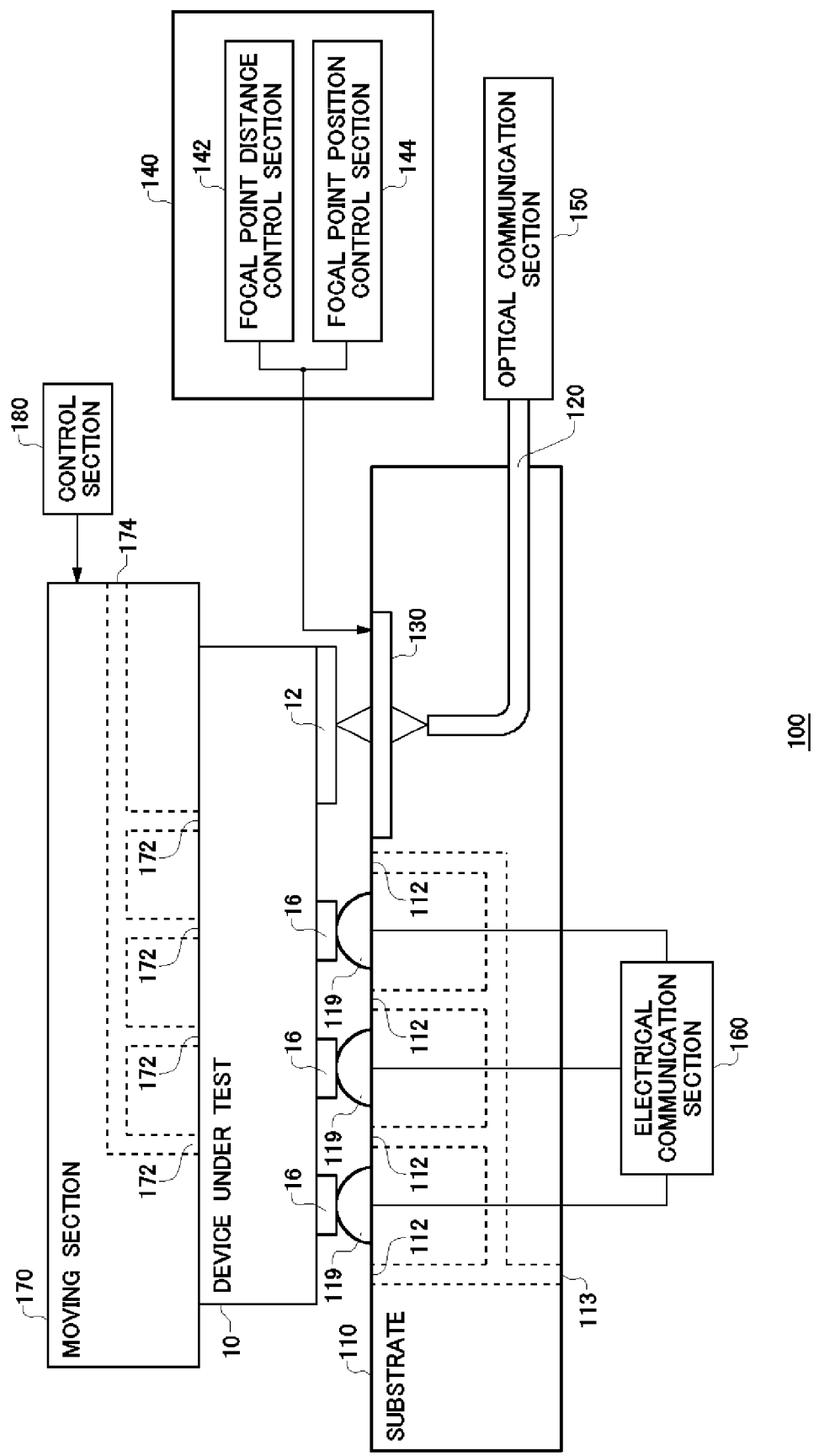
FIG. 1 shows an exemplary configuration of an interface between a device under test 10 and a test apparatus 100, according to an embodiment of the present invention.

FIG. 1 shows an exemplary configuration of an interface between a device under test 10 and a test apparatus 100, according to an embodiment of the present invention. The test apparatus 100 exchanges optical signals and electrical signals with the device under test 10 having an optical interface to test the device under test 10, which may be an analog circuit, a digital circuit, a memory, or a system on chip (SOC), for example. The device under test 10 includes an optical coupler 12. The device under test 10 may include terminals 16.

The optical coupler 12 transmits optical signals in a direction perpendicular to the device surface. The optical coupler 12 may be optically coupled to an optical circuit or an optical transmission path formed within the device under test 10, for example, and exchange optical signals with an optical circuit or an optical transmission path formed outside the device under test 10. The optical coupler 12 may receive an optical beam that can be focused with predetermined conditions concerning the focusing position and the aperture angle, and output an optical beam having the predetermined focusing position and aperture angle. Instead, the optical coupler 12 may receive incident collimated light with predetermined conditions concerning the focusing position and the beam diameter, and output collimated light having the predetermined focusing position and beam diameter.

The terminals 16 transmit electrical signals. The terminals 16 may be solder bumps, lands, or connectors, for example. The terminals 16 may include one or more input terminals and one or more output terminals for inputting and outputting electrical signals.

The device under test 10 is loaded in the test apparatus 100 in order for the test apparatus 100 to exchange electrical and optical signals with the device under test 10. The test apparatus 100 includes a substrate 110, an optical transmission path 120, a lens section 130, a lens control section 140, an optical communication section 150, an electrical communication section 160, a moving section 170, and a movement control section 180.

The device under test 10 is loaded on the substrate 110. The substrate 110 includes adhering units 112 and a suction unit 113. The substrate 110 may include electrodes 119 for exchanging electrical signals with the device under test 10.

The adhering units 112 exert suction to adhere the device under test 10 thereto. The adhering units 112 may be formed on the top surface of the substrate 110 to physically contact the device under test 10 and exert suction to adhere the device under test 10 thereto. When the space between the device under test 10 and the substrate 110 is sealed, the adhering units 112 may adhere the device under test 10 thereto by exerting suction in the sealed space. The suction unit 113 is connected to a pump, for example, to expel air from the adhering units 112 or the atmospheric gas above the substrate 110.

The electrodes 119 are connected to the electrical communication section 160, and contact the terminals 16 of the device under test 10. The electrodes 119 may be terminals, probes, cantilevers, or membranes that directly contact the terminals 16, for example. If the terminals 16 are connectors, the electrodes 119 may be connectors that engage with the terminals 16. The substrate 110 may have a number of electrodes 119 greater than or equal to the number of terminals 16 of the device under test 10.

The optical transmission path 120 transmits optical signals. The optical transmission path 120 may be an optical fiber, or may be a waveguide. The optical transmission path 120 transmits optical signals from the optical communication section 150 connected to one end thereof and outputs the signals toward the lens section 130 from the other end thereof. The optical transmission path 120 may output optical signals with predetermined aperture angles. The optical transmission path 120 also transmits optical signals received from the lens section 130 at one end thereof to the optical communication section 150 connected to the other end thereof.

The lens section 130 is provided facing the optical coupler 12 on the substrate, and focuses an optical signal from the end of one of the optical coupler 12 and the optical transmission path 120 to the end of the other. The lens section 130 may include one or more optical lenses. The lens section 130 includes a variable-focus lens for which at least one of the focal distance and the focal position is variable. The lens section 130 may include the variable-focus lens and an optical lens for which the focal distance and the focal position are fixed. The variable-focus lens of the lens section 130 may be a liquid crystal lens in which the focal distance and focal position are changed by using an electrical signal to control the orientation of the liquid crystal.

Instead, the variable-focus lens may use electro-optical crystal such as KTN (potassium tantalum niobium oxide) or PZT (lead zirconate titanate) in which the refractive index changes according to an electric signal. Instead, the variable-focus lens may be a dynamorph lens that controls the shape of the refractive surface with liquid pressure, by using an interface between two fluids that do not mix as the refractive surface. As yet another example, the variable-focus lens may be a lens having a silicon gel surface that curves according to a polymer actuator pressing the gel toward an opening. The focal point of the variable-focus lens may be controlled by the lens control section 140.

The lens control section 140 controls the focal point of the variable-focus lens of the lens section 130. For example, the lens control section 140 may further include a focal distance control section 142 that establishes optical coupling according to the focal distance of the lens section 130, and may adjust the focal position of the lens section 130 to be on the surface of the optical coupler 12. The lens control section 140 further includes a focal position control section 144 that establishes optical coupling by changing the focal position of the lens section 130, and adjusts the focal position of the lens section 130 to be a predetermined position on the surface of the optical coupler 12. If the lens section 130 includes a moving stage that moves the lens having a fixed focal position, the lens control section 140 may transmit a control signal to the moving stage to adjust the focal position of the fixed lens to be on the surface of the optical coupler 12 and/or at a predetermined position on the surface of the optical coupler 12.

The optical communication section 150 is connected to the optical coupler 12 of the device under test 10 via the optical transmission path 120 and the lens section 130, and transmits optical signals to and from the device under test 10. The optical communication section 150 may be loaded on the substrate 110, or may be loaded on a separate substrate. The optical communication section 150 may convert an electrical test signal supplied to the device under test 10 into an optical signal and convert an optical response signal received from the device under test 10 into an electrical response signal.

The electrical communication section 160 transfers electrical signals to and from the device under test 10 via the electrodes 119. The electrical communication section 160 may be loaded on the substrate 110, or may instead be loaded on the test apparatus 100 as a separate substrate. The electrical communication section 160 may provide the device under test 10 with supply power. The electrical communication section 160 may supply the device under test 10 with a test signal and/or a clock signal whose frequency is lower than that of the optical test signal.

The moving section 170 adheres the device under test 10 thereto, moves the device under test 10, and loads the device under test 10 on the substrate 110. The moving section 170 includes adhering units 172 and a suction unit 174. The adhering units 172 are formed on the surface of the moving section 170, and physically contact the device under test 10 to adhere the device under test 10 thereto via suction. The suction unit 174 is connected to a pump, for example, to expel air or atmospheric gas from the adhering units 172. The moving section 170 has an XYZθ stage, for example, that moves according to a control signal from the movement control section 180.

The movement control section 180 causes the moving section 170 to move by transmitting the control signal to the moving section 170, thereby controlling the relative positions of the device under test 10 and the substrate 110. The movement control section 180 may detect the movement amount of the moving section 170 using a sensor, for example, to acquire the relative positions of the device under test 10 and the substrate 110. For example, the substrate 110 or the moving section 170 may be made of glass or silicon, which transmits infrared light, and the test apparatus 100 may emit infrared light toward the device under test 10 from above the moving section 170 or from below the substrate 110. The movement control section 180 may acquire the relative positions of the device under test 10 and the substrate 110 by detecting the reflected light or transmitted light resulting from infrared light being emitted toward the device under test 10 and passing through the substrate 110 or the moving section 170.

The substrate 110 and/or the moving section 170 may include an alignment mark on which the infrared light is to be irradiated. The movement control section 180 may align the positions of the substrate 110 and/or the moving section 170 by detecting the position of the substrate 110 or the moving section 170 whose alignment mark is irradiated with infrared light.

Figure 2:
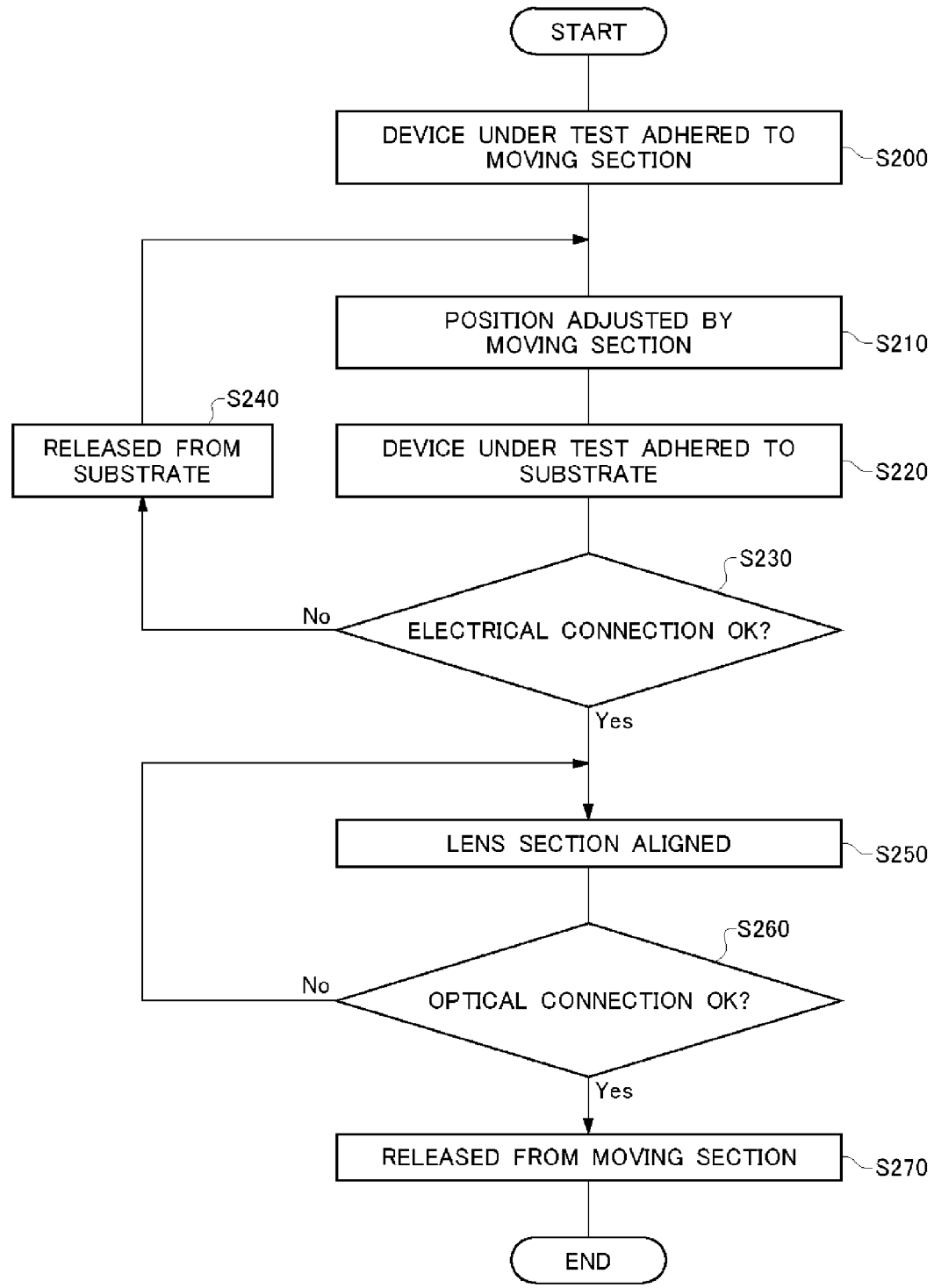
FIG. 2 shows a process flow of the test apparatus 100 according to the present embodiment.

FIG. 2 shows a process flow of the test apparatus 100 according to the present embodiment. The test apparatus 100 adheres the device under test 10 to the moving section 170 (S200). At this time, the test apparatus 100 may align the relative positions of the moving section 170 and the substrate 110.

The movement control section 180 transmits the control signal to the moving section 170 to move the moving section 170 to a position where the device under test 10 is to be loaded on the substrate 110 (S210). The test apparatus 100 can adjust the focal position of the lens section 130. For example, the test apparatus 100 can adjust the focal position of the lens section 130 after electrically connecting the terminals 16 of the device under test 10 to the electrodes 119 of the substrate 110. Therefore, the test apparatus 100 moves the device under test 10 to a position at which the terminals 16 of the device under test 10 are physically contacting the electrodes 119 of the substrate 110.

Next, the test apparatus 100 adheres the device under test 10 to the substrate 110 (S220). In this way, the test apparatus 100 loads the device under test 10 onto the substrate 110 while maintaining an electrical connection.

The test apparatus 100 tests the electric connection of the device under test 10 (S230). The test apparatus 100 supplies the terminals 16, via the electrodes 119, with a predetermined electrical signal from the electrical communication section 160, such as an electrical signal having a predetermined pattern or H/L logic values. The test apparatus 100 receives the response signals output by the terminals 16 via the electrodes 119 at the electrical communication section 160 to test the connection state of the electrical signals.

For example, the test apparatus 100 may judge the connection state to be successful when a prescribed voltage is supplied by the electrical communication section 160 as the predetermined electrical signal and the electrical communication section 160 receives a voltage value within a predetermined range. If a successful connection is not detected, the test apparatus 100 changes the position of the device under test 10. In other words, the test apparatus 100 dissolves the adhesion exerted on the device under test 10 by the adhering units 112 of the substrate 110 (S240). The test apparatus 100 then returns to step S210 and again performs the process of using the moving section 170 to load the device under test 10 on the substrate 110. The test apparatus 100 may repeat the processes from step S210 to step S230 until the test of the electrical connection results in success.

If the electrical connection test results do not indicate success even after repeated loadings of the device under test 10, the test apparatus 100 may judge the device under test 10 to be unacceptable. For example, if the electrical connection test results indicate failure even after a predetermined number of repeated loadings of the device under test 10, the test apparatus 100 may judge the electrical interface of the device under test 10 to be unacceptable, and end the testing of the device under test 10.

When the electrical connection test of the device under test 10 results in success, the test apparatus 100 adjusts the focal point of the lens section 130 (S250). For example, the test apparatus 100 may transmit a control signal from the focal distance control section 142 of the lens control section 140 to adjust the focal distance of the lens section 130 to be on the surface of the optical coupler 12. Here, the focal distance control section 142 may adjust the focal distance of the lens section 130 to be a predetermined distance. The test apparatus 100 may measure the distance between the lens section 130 and the optical coupler 12 in advance, record this distance, and read the recorded distance to adjust the focal distance of the lens section 130 to be the recorded distance.

Instead, the lens section 130 may include a photodetecting section that detects a component resulting from the optical signal output from the optical transmission path 120 being dispersed or reflected at the surface of the optical coupler 12, and the focal distance control section 142 may adjust the focal distance according to the strength of the dispersed light or reflected light measured by the photodetecting section. For example, when the focal distance is adjusted to be on the surface of the optical coupler 12, the lens section 130 focuses the optical signal output from the optical transmission path 120 to a single point on the surface of the optical coupler 12, and therefore the dispersed light and reflected light are at maximum strength. Accordingly, the test apparatus 100 may gradually change the focal distance of the lens section 130 while irradiating the surface of the optical coupler 12, via the optical transmission path 120, with light of a prescribed strength output by the optical communication section 150, and may fix the gradually changing focal distance when this focal distance is adjusted to be the focal distance that causes the dispersed light or reflected light from the surface of the optical coupler 12 to be at maximum strength.

Instead, in order to measure the distance between the lens section 130 and the optical coupler 12, the lens section 130 may include a distance measuring section that measures distance to the optical coupler 12 by receiving reflected light resulting from emitted laser light or the like being reflected by the surface of the optical coupler 12. In this case, the focal distance control section 142 may adjust the focal distance according to the distance between the lens section 130 and the optical coupler 12 measured by the distance measuring section.

After adjusting the focal distance of the lens section 130 to be on the surface of the optical coupler 12, the test apparatus 100 may change the focal position of the lens section 130 on the surface of the optical coupler 12 to be a predetermined position on the surface of the optical coupler 12. For example, the test apparatus 100 may transmit a control signal from the focal position control section 144 of the lens control section 140 to adjust the focal position of the lens section 130 to be on the surface of the optical coupler 12.

Here, the focal position control section 144 may detect the state of the optical coupling while moving the focal position of the lens section 130 in a spiral within a plane parallel to the lens, to detect the focal position at which optical coupling is established. Instead, the focal position control section 144 may scan and detect the state of the optical coupling while moving the focal position of the lens section 130 in a plurality of straight lines on a plane parallel to the lens, to detect the focal position at which the optical coupling is established. In this way, the focal position control section 144 can continuously scan focal positions of the lens section 130 to adjust the focal position to be a predetermined focusing position on the surface of the optical coupler 12, and can therefore quickly adjust the focal position.

The focal position control section 144 may perform a coarse adjustment by enlarging the focal point diameter of the lens section 130 and changing the focal point to be near a focal position at which optical coupling can be established. After this, the focal position control section 144 may narrow the focal point diameter to perform a fine adjustment of the focal position. In this way, the focal position control section 144 can cause the distance that is scanned on the surface of the optical coupler 12 to be shorter than if the focal point diameter of the lens section 130 were not first enlarged, and can therefore more quickly adjust the focal point.

The device under test 10 receives the optical signal incident to the optical coupler 12, and may notify the test apparatus 100, via an electrical signal or an optical signal, concerning whether the strength of the received optical signal is within a predetermined range. Instead, the device under test 10 may detect the strength of the optical signal received by the optical coupler 12 and notify the test apparatus 100 concerning this strength via an electric signal or an optical signal. As another example, the device under test 10 may transmit a portion of the optical signal received by the optical coupler 12 to the test apparatus 100 as an optical signal. In this case, the device under test 10 may branch the optical signal received by the optical coupler 12 using an optical branching coupler, for example, and transmit one of the branched signals to the internal optical circuit and the other to the test apparatus 100. As yet another example, when adjusting the focal point of the lens section 130, the device under test 10 may switch an optical switch, for example, to transmit the optical signal received by the optical coupler 12 to the test apparatus 100.

The test apparatus 100 may test the optical connection by adjusting the focal position of the lens section 130 to be on the surface of the optical coupler 12, based on an electrical signal or an optical signal transmitted from the device under test 10 according to the optical signal emitted to the optical coupler 12 via the lens section 130 (S260). For example, when the signal transmitted from the device under test 10 is an electrical signal, the test apparatus 100 may use the electrical connection established at step S230 to exchange electrical signals and determined whether the focal position of the lens section 130 has been correctly adjusted. The substrate 110 may further include a photodetecting section, and when the signal transmitted from the device under test 10 is an optical signal, the test apparatus 100 may determine whether the focal position of the lens section 130 has been correctly adjusted based on this optical signal detected by the substrate 110.

When the optical connection is a failure, the test apparatus 100 changes the focal position of the lens section 130. In other words, the test apparatus 100 may repeatedly perform the processes from step S250 to step S260 until the optical connection results indicate success.

If the optical connection test results do not indicate success even after repeated changes of the focal position of the lens section 130, the test apparatus 100 may judge the device under test 10 to be unacceptable. For example, if the connection test results indicate failure even after the focal point of the lens section 130 is changed a predetermined number of times or for a predetermined time, the test apparatus 100 may judge the optical interface of the device under test 10 or the relative positions of the optical interface and the electrical interface to be unacceptable, and end the testing of the device under test 10.

When the optical connection test of the device under test 10 results in success, the test apparatus 100 ends testing of the connections between the device under test 10 and the substrate 110, and dissolves the adhesion of the moving section 170 (S270). With the embodiment described above, the test apparatus 100 can obtain successful optical and electrical connections between the device under test 10 and the substrate 110, and therefore the device under test 10 can be loaded on the substrate 110 without a precise optical axis adjustment of the optical input and output. After this, the test apparatus 100 begins an operational test of the device under test 10.

In the present embodiment, the test apparatus 100 establishes optical coupling by adjusting the focal distance and the focal position of the lens section 130. Instead, the test apparatus 100 may store in advance control information for the lens section 130 concerning at least one of the established focal distance and the established focal position, and reproduce the at least one of the established focal distance and the established focal position by reading the stored control information. In this way, the test apparatus 100 can shorten the time needed to establish the optical coupling. Furthermore, by using the same focal distance and focal position based on the stored control information for the optical coupling, the test apparatus 100 can measure the accuracy and/or the distribution of the light focusing position of the optical coupler 12 of the device under test 10.

Figure 3:
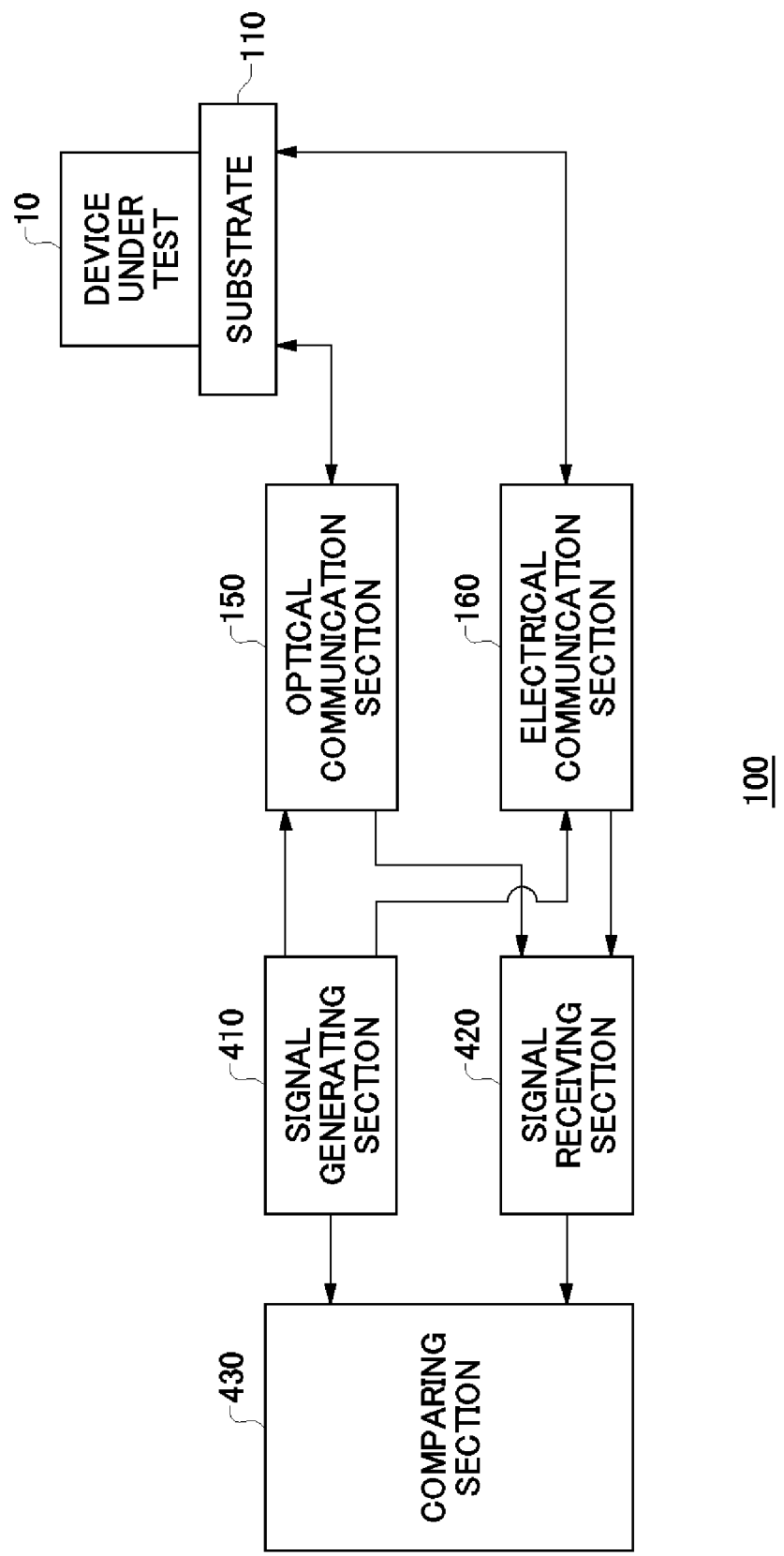
FIG. 3 shows an exemplary configuration of a test apparatus 100 according to an embodiment of the present invention, along with a device under test 10.

FIG. 3 shows an exemplary configuration of a test apparatus 100 according to an embodiment of the present invention, along with a device under test 10. Components of the test apparatus 100 of the present embodiment that have substantially the same operation as components in the test apparatus 100 shown in FIG. 1 are given the same reference numerals and further description is omitted. The test apparatus 100 exchanges optical signals and electrical signals with the device under test 10 having an optical coupler for transmitting optical signals in a direction perpendicular to the device surface, to test the device under test 10, which may be an analog circuit, a digital circuit, an analog/digital mixed circuit, a memory, or a system on chip (SOC), for example.

The test apparatus 100 supplies the device under test 10 with a test signal based on a test pattern for testing the device under test 10, and judges pass/fail of the device under test 10 based on the output signal output by the device under test 10 in response to the test signal. Test signals supplied to the device under test 10 by the test apparatus 100 may be electric signals and/or optical signals, and the output signals output by the device under test 10 may also be electric signals and/or optical signals. The test apparatus 100 further includes a signal generating section 410, a signal receiving section 420, and a comparing section 430.

The signal generating section 410 generates a plurality of test signals to be supplied to the device under test 10, according to a test program. The signal generating section 410 transmits test signals to the optical communication section 150 when supplying optical test signals to the device under test 10. The optical communication section 150 supplies the device under test 10 with the optical test signals obtained by performing an electro-optical conversion on the received test signals. The signal generating section 410 transmits test signals to the optical communication section 150 when supplying electrical test signals to the device under test 10. The optical communication section 150 supplies the device under test 10 with the received test signals. The signal generating section 410 may generate expected values for response signals output by the device under test 10 in response to the test signals, and transmit the expected values to the comparing section 430.

When an optical response signal output by the device under test 10 in response to an electrical or optical test signal is received, the optical communication section 150 transmits to the signal receiving section 420 a response signal obtained by performing an optical-electro conversion on the optical response signal. When an electrical response signal output by the device under test 10 in response to an electrical or optical test signal is received, the optical communication section 150 transmits the received response signal to the signal receiving section 420. The signal receiving section 420 may transmit the received response signal to the comparing section 430. The signal receiving section 420 may record the received response signal in a recording apparatus.

The comparing section 430 compares the response signal received from the comparing section 430 to the expected value received from the signal generating section 410. The test apparatus 100 may judge pass/fail of the device under test 10 based on the comparison result by the comparing section 430. In this way, the test apparatus 100 can test a device under test 10 including an optical coupler by exchanging optical signals and electrical signals with the device under test 10.

Furthermore, the test apparatus 100 can exchange test signals and response signals with the device under test 10 at high speed, by transmitting high-frequency signals over several hundred MHz, which are difficult to send as electric signals, as optical signals. In this way, the test apparatus 100 can test the device under test 10 while causing the device under test 10 to operate at its actual operating speed.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus for testing a device under test by transmitting a test optical signal to the device under test and receiving, in response, a device optical signal from the device under test, the device under test including an optical coupler for receiving the test optical signal from the test apparatus and for transmitting the device optical signal to the test apparatus, the test apparatus comprising;
    a substrate on which the device under test is to be loaded;
    a lens provided on the substrate that faces the optical couple and focuses the device optical signal from the optical coupler; and
    an optical transmission path that transmits the test optical signal to the device under test and transmits the device optical signal received from the lens, wherein
    the device optical signal results from processing of the test optical signal by the device under test.

2. The test apparatus according to claim 1, wherein the lens includes a variable-focus lens for which at least one of a focal distance and a focal position is variable.

3. The test apparatus according to claim 2, wherein the variable-focus lens is a liquid crystal lens.

4. The test apparatus according to claim 2, wherein the lens is an optical lens having a fixed focal distance mid a fixed focal position.

5. The test apparatus according to claim 1, wherein the optical transmission path is one of an optical fiber and a waveguide.

6. A method of testing a device under test including, an optical coupler for receiving a test optical signal and transmitting a device optical signal, the method comprising:
    loading the device under test on a substrate;
    transmitting, via an optical transmission path, a test optical signal to the device under test and receiving, in response, via the optical transmission path, a device optical signal from the device under test, the device optical signal resulting from processing of the test optical signal by the device under test; and
    focusing the device optical signal from the optical coupler with a lens, provided on the substrate, that faces the optical coupler.

7. The method according to claim 6, further comprising establishing an optical coupling by adjusting a focal distance of the lens.

8. The method according to claim 6, further comprising establishing an optical coupling by adjusting a focal position of the lens.

9. The method according to claim 8, further comprising detecting a state of the optical coupling while moving the focal position of the lens in a spiral in a plane parallel to the lens to detect a focal position that establishes the optical coupling.

10. The method according to claim 8, further comprising:
    performing a coarse adjustment by enlarging a focal point diameter of the lens;
    changing the focal point to be near a focal position at which the optical coupling can be established; and
    performing a fine adjustment of the focal position by narrowing the focal point diameter.

11. The method according to claim 8, further comprising:
    transmitting electrical signals to and from the device under test through a terminal of the device under test;
    wherein the substrate includes an electrode that is configured to contact the terminal, and after the terminal of the device under test and the electrode of the substrate are electrically connected to each other, the focal position of the lens is adjusted.

12. The method according to claim 6, further comprising exerting suction on the device under test to adhere the device under test to the substrate.

13. The method according to claim 6, further comprising; moving the device under test to load the device under test on the substrate.

14. The method according to claim 6, further comprising:
    storing control information for the lens section concerning at least one of established focal distance and established focal position; and
    reproducing the at least one of the established focal distance and the established focal position by reading the stored control information.

15. The method according to claim 6, further comprising comparing the device optical signal with an expected value.

16. The method according to claim 6, further comprising generating the test optical signal according to a test program.

17. The method according to claim 16, wherein an expected value signal is generated, and the expected value signal is transmitted to a comparing section.

18. An apparatus for facilitating testing of a device under test by transmitting a test optical signal to the device under test and receiving, in response, a device optical signal from the device under test, the device under test including an optical coupler for receiving the test optical signal from the apparatus and for transmitting the device optical signal to the apparatus, the apparatus comprising:
    a substrate on which the device under test is to be loaded;
    a lens provided on the substrate that faces the optical coupler and focuses the device optical signal from the optical coupler, wherein at least one of a focal distance and a focal position of the lens is variable; and
    an optical transmission path that transmits the test optical signal to the device under test and transmits the device optical signal received from the lens, wherein
    the device optical signal results from processing of the test optical signal by the device under test.

19. The apparatus according to claim 18, wherein an optical coupling is established by adjusting at least one of the focal distance and the focal position of the lens.

20. The apparatus according to claim 18, further comprising:
    a storage device in communication with the lens, the storage device operable to store control information for the lens section concerning at least one of established focal distance and established focal position; and a processor in communication with the storage device, the processor operable to reproduce the at least one of the established focal distance and the established focal position by reading the stored control information.

* * * * *